US010522972B2

(12) United States Patent
Carter (10) Patent No.: US 10,522,972 B2
(45) Date of Patent: Dec. 31, 2019

(54) TUNEABLE DBR LASER WITHOUT EXTERNAL FREQUENCY LOCKER

(71) Applicant: Oclaro Technology Limited, Towcester, Northamptonshire (GB)

(72) Inventor: Andrew Cannon Carter, Blisworth (GB)

(73) Assignee: Lumentum Technology UK Limited, Northamptonshire (GB)

( * ) Notice: Subject to any disclaimer, the term of this patent is extended or adjusted under 35 U.S.C. 154(b) by 0 days.

(21) Appl. No.: 16/331,926

(22) PCT Filed: Sep. 28, 2017

(86) PCT No.: PCT/GB2017/052906
§ 371 (c)(1),
(2) Date: Mar. 8, 2019

(87) PCT Pub. No.: WO2018/060710
PCT Pub. Date: Apr. 5, 2018

(65) Prior Publication Data
US 2019/0207367 A1   Jul. 4, 2019

(30) Foreign Application Priority Data
Sep. 30, 2016   (GB) .................................. 1616633.2

(51) Int. Cl.
*H01S 3/10* (2006.01)
*H01S 5/0625* (2006.01)
(Continued)

(52) U.S. Cl.
CPC ........ *H01S 5/06256* (2013.01); *H01S 5/0264* (2013.01); *H01S 5/0617* (2013.01);
(Continued)

(58) Field of Classification Search
CPC ...... H01S 5/125; H01S 5/0624; H01S 5/0617; H01S 5/06255; H01S 5/06256;
(Continued)

(56) References Cited

U.S. PATENT DOCUMENTS 6,064,681 A * 5/2000 Ackerman ............ H01S 5/0687
372/20
6,101,210 A   8/2000 Bestwick et al.
(Continued)

FOREIGN PATENT DOCUMENTS

EP    1130718 A2   9/2001
EP    1172905 A1   1/2002

OTHER PUBLICATIONS

GB Search Report, GB Application No. GB1616633.2, dated Mar. 7, 2017, 5 pages.
(Continued)

*Primary Examiner* — Kinam Park
(74) *Attorney, Agent, or Firm* — Harrity & Harrity, LLP (57) ABSTRACT

In accordance with one aspect of the present application there is provided a DBR, laser. The DBR laser comprises a phase section in a cavity of the DBR laser configured to adjust an optical path length of the cavity. The laser also comprises a DBR section comprising a frequency tuning system, the frequency tuning system comprising a resistance heater configured to apply heat to a grating of the DBR section in order to adjust a Bragg frequency of the DBR section. A detector is configured to detect laser light transmitted through the DBR section. A controller is configured: to cause the phase section to apply a dither to the optical path length of the cavity or cause the frequency tuning system to apply a dither to the Bragg frequency of the DBR section; to use the detector to monitor intensity of light transmitted from the laser cavity via the DBR section during application of the dither; to determine a deviation from longitudinal (Continued)

mode centre operation on the basis of the monitored intensity; to cause the phase section to adjust the optical path length of the cavity in order to reduce said deviation; to determine an output frequency of the DBR laser on the basis of a resistance of the resistance heater; and to control the output frequency of the DBR laser by controlling power to the resistance heater.

15 Claims, 5 Drawing Sheets

(51) Int. Cl.
| | |
|---|---|
| *H01S 5/065* | (2006.01) |
| *H01S 5/026* | (2006.01) |
| *H01S 5/06* | (2006.01) |
| *H01S 5/068* | (2006.01) |
| *H01S 5/0687* | (2006.01) |
| *H01S 5/125* | (2006.01) |
| *H01S 5/10* | (2006.01) |

(52) U.S. Cl.
CPC .......... *H01S 5/0654* (2013.01); *H01S 5/0657* (2013.01); *H01S 5/0687* (2013.01); *H01S 5/06255* (2013.01); *H01S 5/06804* (2013.01); *H01S 5/125* (2013.01); *H01S 5/1092* (2013.01)

(58) Field of Classification Search
CPC .. H01S 5/0654; H01S 5/06804; H01S 5/0687; H01S 5/1092; H01S 5/0657
See application file for complete search history.

(56) References Cited

U.S. PATENT DOCUMENTS

| | | | |
|---|---|---|---|
| 6,359,915 B1* | 3/2002 | Koch | H01S 5/06256 372/102 |
| 6,829,262 B1 | 12/2004 | Ackerman et al. | |
| 2002/0051472 A1* | 5/2002 | Morthier | H01S 5/06256 372/29.01 |
| 2003/0035449 A1 | 2/2003 | Tomlinson et al. | |
| 2008/0063016 A1 | 3/2008 | Bhatia et al. | |
| 2008/0279234 A1 | 11/2008 | Gollier et al. | |
| 2011/0116524 A1 | 5/2011 | Banno | |
| 2014/0010249 A1 | 1/2014 | Miura | |
| 2015/0311672 A1* | 10/2015 | Chaouch | H01S 5/0612 372/20 |

OTHER PUBLICATIONS

PCT International Search Report and Written Opinion, PCT Application No. PCT/GB2017/052906, dated Dec. 19, 2017, 15 pages.
PCT International Preliminary Report on Patentability, PCT Application No. PCT/GB2017/052906, dated Sep. 20, 2018, 9 pages.

* cited by examiner

TUNEABLE DBR LASER WITHOUT EXTERNAL FREQUENCY LOCKER

RELATED APPLICATIONS

This application is a 35 U.S.C. 371 national stage filing of International Application No. PCT/GB2017/052906, filed on Sep. 28, 2017, which claims priority from United Kingdom Application No. GB1616633.2 filed on Sep. 30, 2016. The contents of the aforementioned applications are hereby incorporated by reference in their entireties.

FIELD OF THE INVENTION

The present invention relates to a Distributed Bragg Reflector (DBR) laser. In particular, the invention relates to such a laser which is tuneable without the use of a frequency locker.

BACKGROUND

The term "light" as used herein refers to any part of the electromagnetic spectrum, including but not limited to visible light and radio frequency.

Tuneable Distributed Bragg Reflector (DBR) lasers are used to provide accurate, controllable frequency laser light. The optical path length of the laser cavity defines longitudinal modes. The frequencies of the longitudinal modes are such that the round-trip phase for light of that frequency is an integer multiple of 2 pi radians. In a typical DBR laser this round trip phase can be adjusted by electronic or thermal control of a small length of the laser cavity known as a 'phase section' thereby altering the refractive index and therefore the optical path length locally in that section. Electronic control is achieved by injecting current into the phase section, and thermal control is achieved by altering its temperature.

In a DBR laser, frequency selectivity is achieved using a length of grating, known as a distributed Bragg reflector (DBR), at one end the cavity. When the frequency of the peak reflectivity of the grating (Bragg frequency) is aligned to the frequency of one of the longitudinal modes lasing can occur with high efficiency in that longitudinal mode and the laser is said to be operating at the mode centre. The Bragg frequency of the DBR may be adjusted by electronic or thermal control. When the Bragg frequency and the longitudinal mode frequency move apart (either due to changes in the DBR section, the phase section or other parts of the laser cavity over life) the laser will continue to lase at the longitudinal mode frequency, but reflection from the grating is no longer maximised.

The frequency is typically controlled by means of an external frequency reference, such as an etalon, used as a frequency locker. The laser frequency is corrected by adjusting some control parameter (such as the phase section current, or the overall chip temperature) that adjusts the optical cavity length and hence the longitudinal mode frequencies. Frequency lockers add complexity and cost to a device, and for some applications (for example where the frequency does not need to be controlled to very high tolerance) it would be beneficial to operate without the need for a frequency locker.

In addition, the performance of all sections of the laser is temperature dependent (indeed, this is the principle behind thermal control). This means that the operating temperature of a DBR laser must be consistent within a small range in order not to throw off the calibration. The cooling required to achieve this adds significantly to the cost and size of the DBR laser. Being able to provide a laser which is not dependent on operating temperature would be particularly useful for low-cost and low-space applications. For thermally controlled lasers, the operating temperature can be considered as the temperature of parts of the laser chip distant from the heating elements used for thermal control.

SUMMARY

In accordance with one aspect of the present application there is provided a DBR, laser. The DBR laser comprises a phase section in a cavity of the DBR laser configured to adjust an optical path length of the cavity. The laser also comprises a DBR section comprising a frequency tuning system, the frequency tuning system comprising a resistance heater configured to apply heat to a grating of the DBR section in order to adjust a Bragg frequency of the DBR section. A detector is configured to detect laser light transmitted through the DBR section. A controller is configured: to cause the phase section to apply a dither to the optical path length of the cavity or cause the frequency tuning system to apply a dither to the Bragg frequency of the DBR section; to use the detector to monitor intensity of light transmitted from the laser cavity via the DBR section during application of the dither; to determine a deviation from longitudinal mode centre operation on the basis of the monitored intensity; to cause the phase section to adjust the optical path length of the cavity in order to reduce said deviation; to determine an output frequency of the DBR laser on the basis of a resistance of the resistance heater; and to control the output frequency of the DBR laser by controlling power to the resistance heater.

Thus the frequency can be selected simply by selection of the resistance of the heater associated with the DBR section. No separate frequency locker is required.

In accordance with another aspect of the present invention there is provided a method of operating a DBR laser which comprises a DBR section comprising a frequency tuning system, the frequency tuning system comprising a resistance heater configured to apply heat to a grating of the DBR section in order to adjust a Bragg frequency of the DBR section. The method comprises applying a dither to one or both of a Bragg frequency of a DBR section of the DBR laser and an optical path length of a cavity of the DBR laser and monitoring intensity of light transmitted through the DBR section of the DBR laser. A deviation from longitudinal mode centre operation is determined on the basis of the monitored intensity. The method further comprises adjusting either the optical path length of the cavity in order to reduce said deviation, determining an output frequency of the DBR laser on the basis of a resistance of the resistance heater, and controlling the output frequency of the DBR laser by controlling power to the resistance heater.

Further aspects and preferred features are set out in claim 2 et seq.

DETAILED DESCRIPTION

In order to achieve laser operation without a locker, a laser would be required to have accurate correspondence between inputs to the tuning sections and output frequency. In current designs, this is not possible due to mode boundary movement.

When the Bragg frequency and the longitudinal mode frequency move apart (either due to changes in the DBR section, the phase section or other parts of the laser cavity over life) the laser will continue to lase at the longitudinal mode frequency, but reflection from the grating is no longer maximised. This typically results in degraded laser performance—increased threshold current, reduced output power and reduced side mode suppression ratio (SMSR). The laser is said to be operating away from mode centre. If this detuning continues to increase eventually the laser will jump from one longitudinal mode to a more favourable one—one where the detuning between the longitudinal mode frequency and the Bragg frequency is reduced. Such a jump is associated with a large change in lasing/output frequency and is highly undesirable.

In current designs the lasing frequency is controlled over life without any attempt to maintain operation at the mode centre. A frequency locker will compensate for minor variations in output due to operation off mode centre. Once the correction from the start of life calibrated value of that parameter becomes greater than a predetermined limit then the laser is deemed to have reached the end of its life. This is to ensure that there is minimal risk of a longitudinal mode jump during operation. However, since the wavelength locker has no information on the actual proximity of such a jump the laser life is being artificially shortened and the risk of mode jumps cannot be completely eliminated. Furthermore, as discussed above, in some applications it would be desirable to be able to operate without a frequency locker.

Mode Centre Control

When light is incident on a Bragg reflector, a certain fraction of the incident light will be reflected (R), a certain fraction transmitted through the reflector (T) and a certain fraction absorbed (A). R+A+T=1. When a DBR laser is operating at mode centre, R is maximised for the rear DBR section. It is not feasible to measure R directly. However since A is typically small measuring T can be used to give an approximate measure of R (R=1-T).

Figure 1:
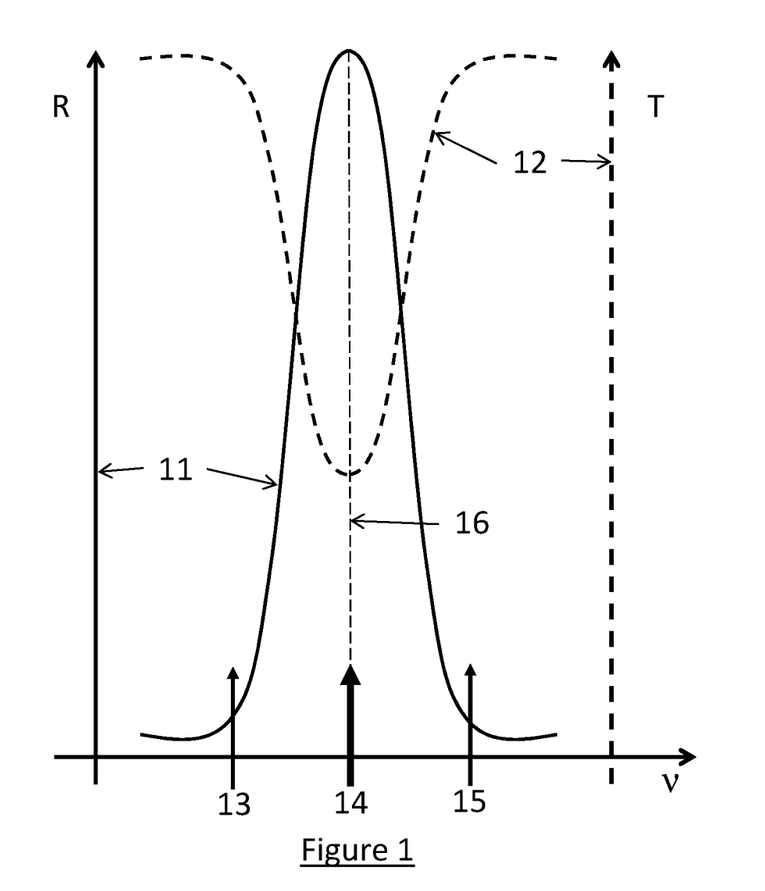
FIG. 1 is a graph of reflectance and transmission against frequency for a DBR section.

FIG. 1 shows a graph of R (11) and T (12) against frequency for a DBR section in a DBR laser. The maximum in R (and minimum in T) correspond to the characteristic frequency of the DBR. The frequencies of some of the longitudinal modes of the laser 13-15 are also shown on the frequency axis for a given optical path length of the cavity. Longitudinal mode 14 is the lasing mode in this example (i.e. the mode in which the laser is operating). As can be seen, in this example the longitudinal mode is at the same frequency (16) as the characteristic frequency of the DBR, so the value of R is maximised, and the value of T is minimised for the lasing frequency (i.e. the longitudinal mode frequency.

Figure 2:
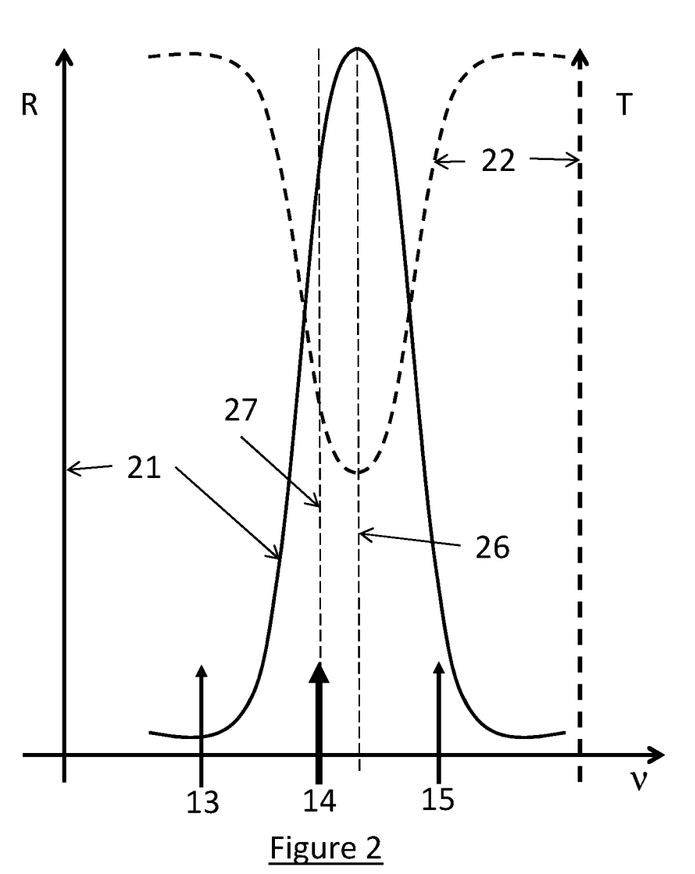
FIG. 2 is a graph of reflectance and transmission against frequency for a DBR section operating off mode centre.

FIG. 2 shows a graph of R (21) and T (22) against frequency for a DBR in a laser operating off mode centre. In this example, the optical path length of the cavity is the same as in FIG. 1, so the frequencies of the longitudinal modes are the same. However, the characteristic frequency (26) of the DBR is different, so the longitudinal mode frequency (27) (i.e. the lasing frequency) no longer lines up with the maximum in R. Where the maximum in R is still closest to the preferred mode 14 (as shown in FIG. 2), the laser will still operate in that mode. If the DBR frequency was closer to an adjacent mode, the laser could hop into that mode (e.g. mode 15), causing it to operate with a different lasing frequency.

The optical power transmitted through the rear DBR section can be detected by placing a detector behind the rear DBR section. Such a detector can be on-chip or off-chip. The detector may be a detector that is part of the frequency locker assembly.

The DBR section requires a frequency tuning system for adjusting the Bragg frequency of the DBR. This may be a control electrode that can alter the Bragg frequency of the DBR. This control electrode may inject current into the DBR section to alter its refractive index and hence the Bragg frequency. Alternatively the control electrode may drive a local heater that alters the temperature of the DBR section and hence alters the Bragg frequency. In additional to any DC control current, a low frequency 'dither' is applied to the DBR frequency tuning system, and the change in transmitted intensity due to that dither can be used to determine the distance from mode centre.

Figure 3:
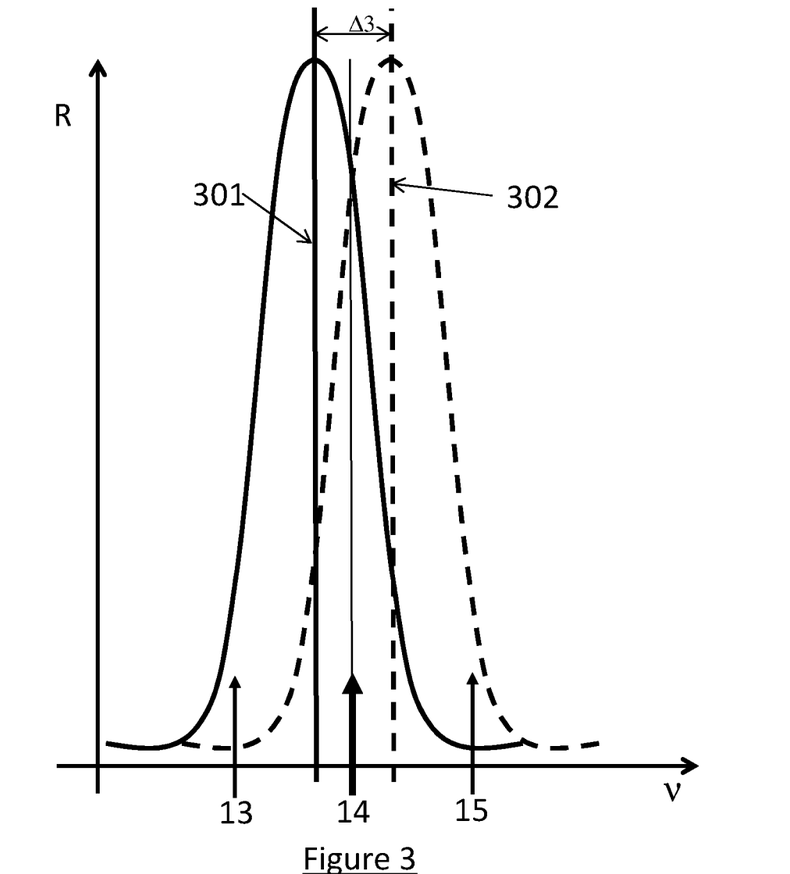
FIG. 3; illustrates DBR section current dithering

FIG. 3 illustrates the application of the dither to the DBR section. For clarity, only the R plot for each value of the DBR frequency is shown. The DBR frequency is configured to vary (Δ3) between a minimum 301 (solid) and a maximum 302 (dotted), while lasing continues on the same longitudinal mode (14). The transmitted intensity is measured during this variation. Mode centre corresponds to the maximum in reflected intensity or minimum in the transmitted intensity in this example. Since the absolute value of the transmitted intensity depends on many factors, not just the distance from mode centre, the variation of the intensity must be used to locate the minimum in the transmitted intensity. At mode centre the amplitude variation in the transmitted intensity during the dither is minimised. Away from mode centre the amplitude variation in the transmitted intensity during the dither is greater and it changes sign depending on whether the Bragg frequency at the centre of the dither range is greater than or less than the longitudinal mode frequency. The magnitude and sign of this amplitude variation can then be used to adjust DC current applied to the DBR section control electrode to move towards the mode centre.

Figure 4:
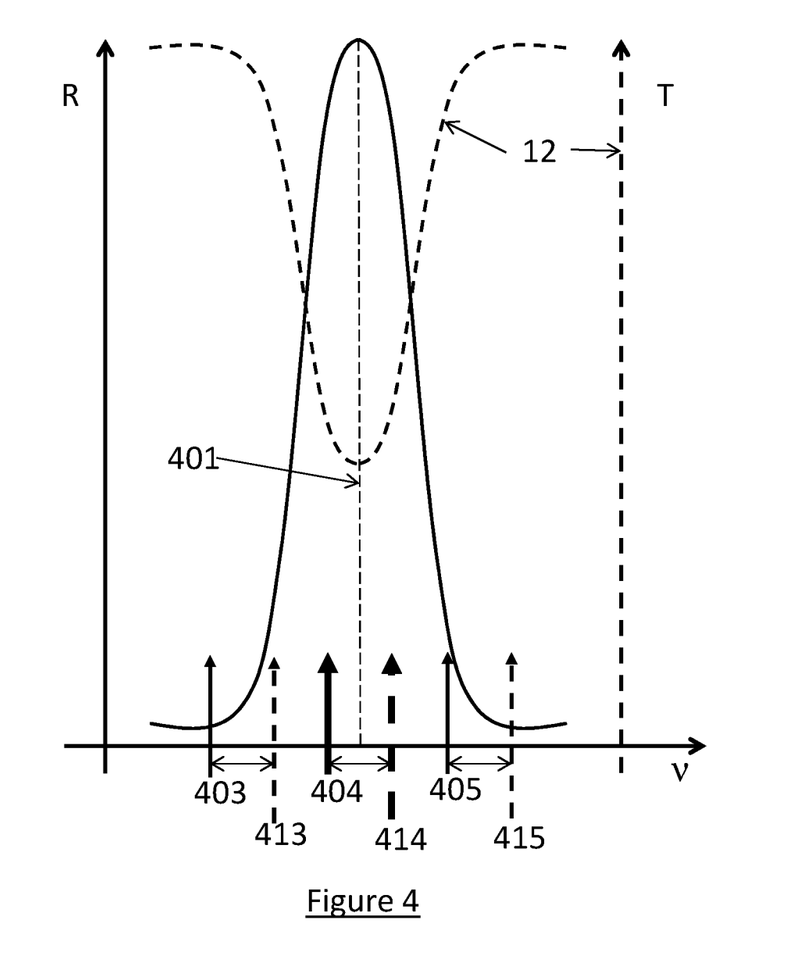
FIG. 4 illustrates phase section current dithering.

Alternatively, the dither may be applied to the phase section of the laser, or some other tuning parameter which adjusts the optical path length of the cavity. This has the disadvantage that it causes a shift in the longitudinal mode, and hence the output frequency of the laser, but in certain applications it may be useful (e.g. where the dither is within the tolerance required for the laser). This can be understood with reference to FIG. 4. The DBR frequency 401 remains stationary, and the optical path length of the cavity is varied to vary the frequency of the longitudinal modes between a minimum (403, 404, 405, solid lines) and a maximum (413, 414, 415, dashed lines). As the laser continues to lase on the mode closest to the DBR frequency, the lasing frequency of the laser will vary with the frequency of this mode (i.e. between the minimum 404 and maximum 414 frequency of the mode). As with the DBR frequency dither, mode centre corresponds to the maximum reflected intensity (and thereby to the minimum transmitted intensity in this example). Away from mode centre the amplitude variation in the transmitted intensity during the dither is greater and it changes sign depending on whether the Bragg frequency at the centre of the dither range is greater than or less than the longitudinal mode frequency. The magnitude and sign of this amplitude variation can then be used to adjust the optical path length of the cavity to move the laser to mode centre (e.g. by applying current to the phase section).

If the laser is found to be operating off mode centre, then the optical path length of the cavity of the laser is adjusted to return it to mode centre operation. This ability to adjust to mode centre operation will significantly improve the operating life of the laser, as a laser will only become unreliable due to mode boundary drift when that drift exceeds the ability of the control elements to compensate (i.e. the adjustment required would be larger than can be provided).

Figure 5:
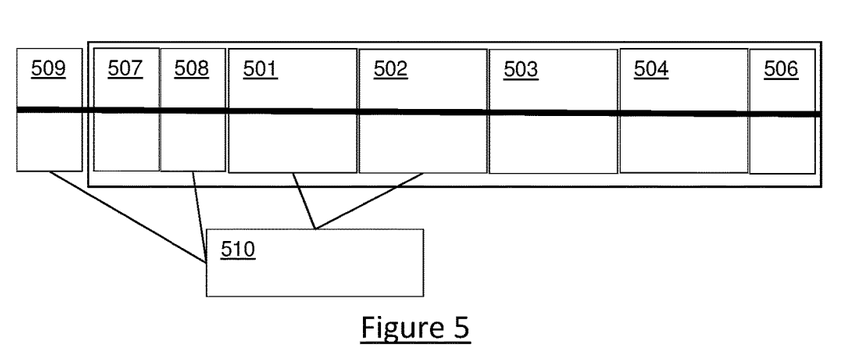
FIG. 5 is a schematic representation of an exemplary DBR laser.

FIG. 5 shows a schematic representation of an exemplary DBR laser. The DBR laser comprises a rear DBR section 501, a phase section 502, a gain section 503, a front reflector 504, a front facet 506, and a rear facet 507. The DBR laser also includes at least one of an on-chip detector 508, or an external detector 509 for detecting transmitted intensity of the rear DBR section. The DBR laser also includes a controller 510 for implementing mode centre control. The controller causes the rear DBR section to apply a dither, and monitors the power/intensity detected by the detector (i.e. transmitted by the rear DBR section). The controller uses the monitored intensity to determine a deviation from mode centre operation, and then causes the phase section to adjust the optical path length of the cavity in order to reduce the deviation.

It will be noted that only the controller 510, rear DBR 501, phase section 502 and detector 508 or 509 are relevant to mode centre control, and the use of mode centre control does not depend on the design of the other components of the DBR laser. For example, although the example shown includes a front reflector 504 and separate front facet 506, in some arrangements the front facet and front reflector may be a single entity.

While mode centre control has been described above with relation to a laser with a rear DBR section and a front reflector, it is equally applicable to a laser with a front DBR section and a rear reflector, or with both the front and rear reflectors being DBR sections. In each case, the detectors should be placed to detect transmitted intensity from (one of) the DBR section(s). Where a detector is placed to detect transmitted intensity from a front DBR section, it should be done in such a way as to still allow an output of light from the laser, e.g. using a beam splitter to "branch off" part of the transmitted light to the detector, or using a detector which allows the beam to pass through with only some modest reduction in intensity.

The controller may be implemented by software running on a generic processor, or by circuitry configured to perform the required functions, by some combination of the two, or by other suitable means.

The detection of transmitted intensity may be implemented by means of a lock-in amplifier. The lock-in amplifier is tuned to the oscillation frequency of the dither signal, and will amplify any features of the transmitted intensity signal which have the same frequency as that dither signal— i.e. features which arise from the dither. The use of a lock-in amplifier helps to remove variations in the transmitted intensity from other sources. The resulting signal is then analysed to determine the deviation from mode centre, and the DBR section current of the laser is adjusted to reduce this deviation.

Lockerless Operation

The output frequency of the laser is defined by the frequency of the longitudinal mode on which it is lasing. When the laser is operating in mode centre, this frequency is the same as the Bragg frequency of the rear DBR section. Therefore, if mode centre control is implemented, the Bragg frequency of the rear DBR section will be equal to the output frequency. In essence, the lockerless control scheme proposed below functions by setting the Bragg frequency to a predetermined value, and then using mode centre control to adjust the longitudinal mode of the laser to the same frequency. Mode centre control is most accurate when the rear DBR section is thermally controlled, so for the output frequency to be sufficiently precise without the use of a locker, thermal control of the rear DBR section is proposed.

Using mode centre control without a locker means that the locker can no longer be relied upon to correct any deviation caused by the dithering used in mode centre control. If the dithering is within tolerances for the application of the laser, then this is not an issue. Dithering of the Bragg frequency of the rear DBR is preferred, as this does not cause a direct change on the output frequency. Dithering of the optical path length of the cavity may be used, provided that the variation is within the tolerances required for the laser. Some compensation for the dithering can be applied by adjusting the operation of other components of the laser.

Where the Bragg frequency of the rear DBR is dithered, the desired output frequency should be within the range of the dither, so that the dithering is around mode centre when the optical length of the cavity has been adjusted. Unlike the general mode centre control disclosed above, for lockerless operation the correction to mode centre must be done by adjusting the optical length of the cavity.

The rear DBR section is heated by a resistance heater, and kept thermally isolated from the rest of the structure (so that heat from the thermal control does not affect the temperature of other control sections). Under thermal control, the Bragg frequency of the rear DBR section depends (to a good approximation) only on temperature.

Therefore, when the laser is operating in mode centre, the output frequency of the laser depends only on the temperature of the rear DBR section (in particular, the temperature of the grating in that section).

In order to have accurate frequency control without a locker in a thermally tuned laser with mode centre control, the temperature of the rear DBR section must be precisely measured. Temperature detection for such a small region is difficult, but may be achieved by the use of a resistance thermometer, i.e. a thermometer which measures the change in resistance of a material in thermal contact with the rear grating, and derives the temperature from that resistance and the variation of resistance with temperature of that material.

While it would be possible to apply a separate resistance thermometer to the grating of the rear DBR section, a neater solution is to use the thermal control mechanism itself to determine the temperature. The thermal control may be implemented by a resistance heater located on the waveguide ridge of the rear DBR section. If the resistance heater is made from a material with sufficient variation in resistance with temperature, then the heater may also be used as a thermometer, since its temperature will correspond to that of the rear DBR section, and its resistance can be easily calculated from the current and voltage applied. This means that no additional structure is required to implement lockerless operation in a laser with a thermally controlled rear grating and mode centre control. The controller of the laser will need to be modified to monitor the rear grating temperature, and to control the frequency accordingly. Since the resistance of the heater is dependent only on the temperature, and the output frequency is dependent only on the temperature, the controller may directly relate the resistance of the heater to the output frequency, without separately determining the temperature. In practice, depending on the power supply, (and given that V=IR) it may be that only voltage or current need to be monitored or adjusted in order to determine or adjust the resistance of the heater and thus the frequency of the DBR and the laser.

A surprising consequence of using mode centre control and monitoring the temperature of the rear grating is that it significantly reduces the dependence of the laser on the operating temperature (i.e. the temperature of components other than those which are thermally controlled). Because the rear DBR grating temperature is well controlled, changes to the operating temperature only affect the cavity length (i.e. optical length) of the laser. In a conventional DBR laser, changes to the cavity length would cause a change in longitudinal mode frequency, and hence output frequency. However, in the lockerless laser, the mode centre control corrects for changes to the cavity length caused by temperature fluctuations, which significantly increases the acceptable operating temperature of the laser. A prototype of the lockerless construction was found to have an operating temperature range of ±5-10° C., which is significantly larger than conventional DBR lasers. If the mode centre control is only activated periodically (e.g. during calibration cycles), then temperature variation between cycles may affect the laser. However, any deviation will be corrected at the next calibration. Therefore, if reduced temperature dependence is required, the dither would preferably be applied constantly or at least frequently (e.g. every few minutes).

The limit to both frequency adjustment and operating temperature tolerance is the phase range of the DBR laser, i.e. the amount that the cavity length can be adjusted. Since both changes in operating temperature and changes in frequency require the optical path length to be changed in order to remain at mode centre, there will eventually come a point where the phase can no longer be adjusted further. In the prototype lockerless laser, this corresponds to ±100 GHz or ±7° C. To allow for further adjustments in the frequency or greater temperature variation, the optical path length can be reset to a different mode when the phase adjustment approaches the limit. In other words, when the longitudinal mode that the laser is operating on is getting close to the point where the wavelength cannot be shifted far enough to align with the desired operating wavelength, the phase section is about to run out of control range. So the laser has to be reset to operate on a different longitudinal mode, one that can be tuned to the desired operating wavelength with less adjustment of the phase section. This involves resetting the phase section control current and therefore resets the optical path length. It also causes a change in the emitted wavelength (mode-hop) while this resetting is going on, so phase resets during operation may not be suitable for all applications of the laser. One approach is to block the light emitted from the laser while the reset takes place.

In order to reduce the number of phase resets needed, the range of the cavity length adjustment should preferably be as high as possible. This may be achieved by using either thermal or electronic adjustment on the phase section, or it could be achieved by using both thermal and electronic adjustment. The use of both thermal and electronic adjustment on the phase section would potentially give a greater phase range, but would make the control more complex due to the temperature dependence of electronic adjustment.

Referring again to FIG. 5, a lockerless DBR laser would have the components referred to above, except for the frequency locker (not shown in figure). The controller 510 is configured to implement the lockerless frequency control described above, i.e. to measure the temperature of the DBR section (e.g. indirectly by measuring one or both of current and voltage of the DBR heater) and determine the output frequency from that temperature (or directly from the quantities from which temperature is derived).

It will be noted that only the controller 510, rear DBR 501, phase section 502 and detector 508 or 509 are relevant to the control scheme presented above, and the use of that control does not depend on the design of the other components of the DBR laser. For example, although the example shown includes a front reflector 504 and separate front facet 506, in some arrangements the front facet and front reflector may be a single entity.

While lockerless control has been described above with relation to a laser with a rear DBR section and a front reflector, it is equally applicable to a laser with a front DBR section and a rear reflector, or with both the front and rear reflectors being DBR sections. In each case, the detectors should be placed to detect transmitted intensity from (one of) the DBR section(s). Where a detector is placed to detect transmitted intensity from a front DBR section, it should be done in such a way as to still allow an output of light from the laser, e.g. using a beam splitter to "branch off" part of the transmitted light to the detector, or using a detector which allows the beam to pass through with only some modest reduction in intensity.

The controller may be implemented by software running on a generic processor, or by circuitry configured to perform the required functions, by some combination of the two, or by other suitable means.

While the above control scheme enables lockerless operation, it will be noted that the absence of a frequency locker is not required to implement the control scheme—for example, a frequency locker could be used as a redundant monitoring system to ensure that the relationship between DBR temperature and Bragg wavelength is stable.

The invention claimed is:

1. A distributed Bragg reflector (DBR), laser, the DBR laser comprising:
   a phase section in a cavity of the DBR laser and configured to adjust an optical path length of the cavity;
   a DBR section comprising a frequency tuning system, the frequency tuning system comprising a resistance heater configured to apply heat to a grating of the DBR section in order to adjust a Bragg frequency of the DBR section;
   a detector configured to detect laser light transmitted through the DBR section; and
   a controller configured to:
      cause the phase section to apply a dither to the optical path length of the cavity or cause the frequency tuning system to apply a dither to the Bragg frequency of the DBR section;
      use the detector to monitor intensity of light transmitted from the cavity via the DBR section during application of the dither;
      determine a deviation from longitudinal mode centre operation on the basis of the monitored intensity;
      cause the phase section to adjust the optical path length of the cavity in order to reduce said deviation;
      determine an output frequency of the DBR laser on the basis of a resistance of the resistance heater; and
      control the output frequency of the DBR laser by controlling power to the resistance heater.

2. The DBR laser according to claim 1, wherein determining the output frequency of the DBR laser on the basis of said resistance comprises determining a temperature of the grating on the basis of the resistance of the resistance heater and determining the output frequency on the basis of said temperature.

3. The DBR laser according to claim 1, wherein the controller is configured to monitor one of a current through or voltage difference across the resistance heater and determine the resistance of the resistance heater from the current or the voltage difference, wherein the other of the current or voltage difference is controlled by the controller or fixed.

4. The DBR laser according to claim 1, wherein the controller is configured to cause the phase controller to reset the optical path length to a different mode prior to said adjustment in a case where causing the phase controller to adjust the optical path length in order to reduce said deviation would require adjusting the optical path length beyond a limit of the phase controller.

5. The DBR laser according to claim 1, wherein the phase section comprises a thermal controller.

6. The DBR laser according to claim 1, wherein the phase section comprises an electronic controller.

7. The DBR laser according to claim 1, wherein the DBR laser does not comprise a separate frequency locker.

8. The DBR laser according to claim 1, wherein the detector is located on a chip containing the DBR section and phase controller.

9. The DBR laser according to claim 8, wherein the detector comprises an inline tap.

10. The DBR laser according to claim 1, wherein the detector is a photodiode.

11. The DBR laser according to claim 1, wherein determining a deviation from mode centre comprises determining a difference between the Bragg frequency of the DBR section and a frequency of a longitudinal mode of the cavity.

12. The DBR laser according to claim 1, wherein determining a deviation from mode centre comprises determining a local minimum of the monitored intensity.

13. The DBR laser according to claim 1, wherein the detector comprises a lock-in amplifier tuned to an oscillation frequency of the dither.

14. A method of operating a distributed Bragg reflector, DBR, laser, wherein the DBR laser comprises a DBR section comprising a frequency tuning system, the frequency tuning system comprising a resistance heater configured to apply heat to a grating of the DBR section in order to adjust a Bragg frequency of the DBR section, the method comprising:
  applying a dither to one or both of a Bragg frequency of a DBR section of the DBR laser and an optical path length of a cavity of the DBR laser;
  monitoring intensity of light transmitted through the DBR section of the DBR laser;
  determining a deviation from longitudinal mode centre operation on the basis of the monitored intensity;
  adjusting either the optical path length of the cavity in order to reduce said deviation;
  determining an output frequency of the DBR laser on the basis of a resistance of the resistance heater; and
  controlling the output frequency of the DBR laser by controlling power to the resistance heater.

15. A non-transitory computer readable-medium configured to store program code instructions, when executed by a processor of a controller of a distributed Bragg reflector, DBR, laser, causes the DBR laser to perform steps, the steps comprising:
  applying a dither to one or both of a Bragg frequency of a DBR section of the DBR laser and an optical path length of a cavity of the DBR laser, wherein the DBR laser comprises the DBR section comprising a frequency tuning system, the frequency tuning system comprising a resistance heater configured to apply heat to a grating of the DBR section in order to adjust a Bragg frequency of the DBR section;
  monitoring intensity of light transmitted through the DBR section of the DBR laser;
  determining a deviation from longitudinal mode centre operation on the basis of the monitored intensity;
  adjusting either the optical path length of the cavity in order to reduce said deviation;
  determining an output frequency of the DBR laser on the basis of a resistance of the resistance heater; and
  controlling the output frequency of the DBR laser by controlling power to the resistance heater.

* * * * *